US006931091B2

(12) United States Patent
Heimbigner

(10) Patent No.: US 6,931,091 B2
(45) Date of Patent: Aug. 16, 2005

(54) GRAY CODE COUNTER

(75) Inventor: Gary L. Heimbigner, Anaheim, CA (US)

(73) Assignee: DRS Sensors & Targeting Systems, Inc., Cypress, CA (US)

( * ) Notice: Subject to any disclaimer, the term of this patent is extended or adjusted under 35 U.S.C. 154(b) by 0 days.

(21) Appl. No.: 10/920,477

(22) Filed: Aug. 18, 2004

(65) Prior Publication Data

US 2005/0129167 A1    Jun. 16, 2005

Related U.S. Application Data

(60) Provisional application No. 60/529,375, filed on Dec. 11, 2003.

(51) Int. Cl.[7] .............................................. H03K 21/00
(52) U.S. Cl. ......................................... 377/34; 377/53
(58) Field of Search ..................................... 377/34, 53

(56) References Cited

U.S. PATENT DOCUMENTS

| | | | |
|---|---|---|---|
| 3,349,332 A | 10/1967 | Bleickardt | .................. 328/42 |
| 4,408,336 A * | 10/1983 | DasGupta | .................... 377/34 |
| 4,512,029 A | 4/1985 | Brice | .......................... 372/33 |
| 4,618,849 A | 10/1986 | Bruestle | |
| 4,937,845 A | 6/1990 | Warner | |
| 5,084,841 A | 1/1992 | Williams et al. | ........ 365/189.07 |
| 5,164,968 A | 11/1992 | Otto | ............................. 377/34 |
| 5,448,606 A * | 9/1995 | Snelgrove | ..................... 377/34 |
| 5,748,949 A | 5/1998 | Johnston | ..................... 395/557 |
| 5,754,614 A | 5/1998 | Wingen | |
| 6,269,138 B1 | 7/2001 | Hansson | |
| 6,314,154 B1 | 11/2001 | Pontius | |
| 6,434,642 B1 | 8/2002 | Camilleri et al. | |

* cited by examiner

*Primary Examiner*—Margaret R. Wambach
(74) *Attorney, Agent, or Firm*—Norris,McLaughlin & Marcus

(57) ABSTRACT

A gray code is produced from a minimum of gate logic by making available and monitoring master outputs of master-slave latch pairs, where the latch pairs are arranged to form a cascading chain of toggle flip-flop stages. The least significant bit through one less than the most significant bit in the gray code is supplied by the master latch outputs and the most significant gray code bit is supplied by the slave latch output of the last toggle stage in the chain.

7 Claims, 9 Drawing Sheets

BINARY CODE

GRAY CODE

PRIOR ART

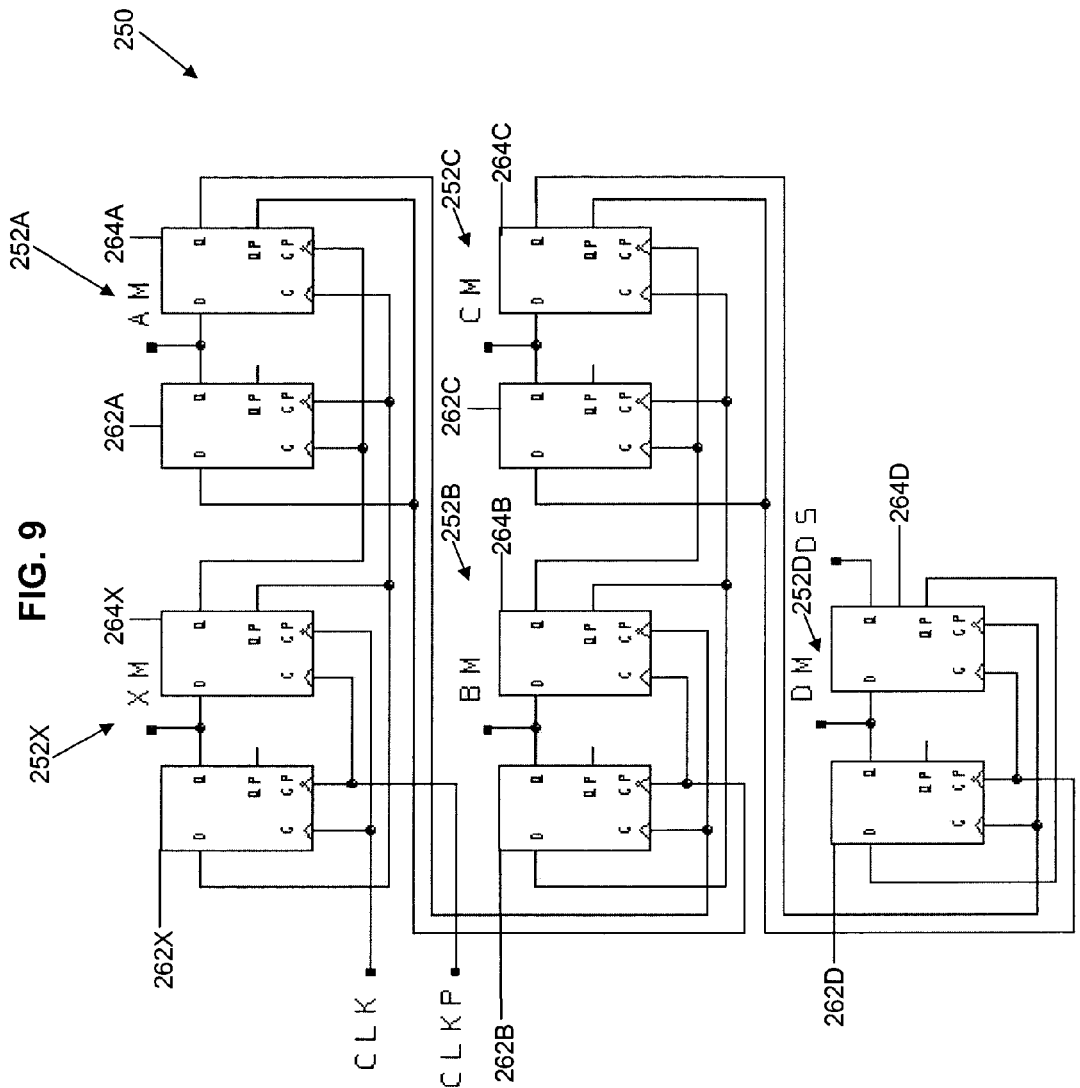

GRAY CODE COUNTER

CROSS REFERENCE TO RELATED APPLICATION

This application claims the benefit of U.S. Provisional Application No. 60/529,375 filed Dec. 11, 2003, assigned to the assignee of this application and incorporated by reference herein.

FIELD OF THE INVENTION

The present invention relates generally to digital binary counters and, more particularly, to gray code digital binary counters having a minimum of logic circuitry.

BACKGROUND OF THE INVENTION

Digital binary counters are widely used in digital information processing systems. In general, a digital binary counter is formed from logic circuitry that includes N binary stages having respective bit outputs that change state in response to input pulses received at the counter. The states of the respective bit outputs change in accordance with a binary code that represents numerical values between 0 and $2^N-1$. Consequently, the digital binary counter can be used to generate a binary code that corresponds to a count of the number input pulses received at the counter over a predetermined interval.

One type of digital binary counter is a monotonic or serial binary counter, which generates what is commonly referred to as a natural binary code. As is well known in the art, in a serial binary counter more than one of the N binary stages can change state at a time in response to a single counter input pulse. To obtain an accurate counter reading, the bit outputs of the respective N binary stages should be sampled at a time when none of the binary stages is changing state. Consequently, if there is a slight misalignment in the time of sampling of the bit outputs of the serial binary counter, or if there is a need to sample the bit outputs of the serial binary counter at a time when several of the binary stages are changing state, a large error can occur in the counter reading. FIG. 1A illustrates a natural binary code waveform 10 that a nine bit serial counter would generate. Referring to FIG. 1A, if the bit outputs Q were sampled at a time $t_0$, which corresponds to a time that all nine of the binary stages of the counter are changing state, the potential error in the counter reading can be up to half scale or $2^8$.

Another type of digital counter is a gray binary code counter, which generates what is commonly referred to as a gray code. As is also well known in the art, the logic circuitry of a gray binary code counter differs from that a serial binary code counter in that only one of the binary stages can change state at a time for each counter input pulse. Therefore, the potential error in reading a gray code is independent of sampling time and is only between which of two adjacent count values are correct. FIG. 1B illustrates a gray code waveform 12 that a nine bit gray code binary counter would generate. For purposes of comparing potential counter read errors, the waveforms 10 and 12 are aligned to show the bit outputs that would be generated based on receipt of the same counter input pulses. Referring to FIGS. 1A and 1B, assuming that a counter needs to be read at about the time to, the counter read error is likely to be much greater for the serial binary counter than the gray code counter. See U.S. Pat. Nos. 4,618,849 and 4,937,845, incorporated by reference herein, for a discussion of gray code counter and serial binary counter construction and operation.

In many digital binary counter applications, the bit outputs of the binary counter need to be sampled asynchronously and the counter reading that is obtained must have a minimum of error. These digital binary counter applications, therefore, call for use of a gray code binary counter logic circuitry implementation. For example, an infrared detector focal plane array ("FPA") device typically includes a gray code binary counter to facilitate very accurate detection of an image by imaging pixels. In the FPA, the gray code counter functions to extend the dynamic range of an imaging pixel, which has a linear response characteristic that is relatively limited in range, and also lowers the required pixel read out rate. During operation of the FPA, the pixel in the FPA is reset, i.e., the input charge (detected infrared light energy) is discharged, once the amount of input charge reaches a predetermined level that corresponds to or is near the upper limit of the linear response range for the pixel. The gray code counter in the FPA counts the number of times that a pixel is reset within a fixed interval. The bit outputs of the counter are asynchronously sampled at the end of a successive fixed interval to obtain a gray code reading. The highly precisely counter value corresponding to the gray code reading is then used to compute, with great accuracy, the amount of input charge that the pixel absorbed over the fixed interval. Accordingly, the counts for the respective pixels of the array are used to reconstruct the image (infrared light energy) present in front of the FPA during the fixed interval.

Prior art gray code binary counters, however, are logically complex and require substantial amounts of logic gating in their implementation. For example, referring to FIG. 2, a typical prior art gray code counter 20 having $2^N$ count capability includes N stages of D-type flip-flops 22 and additional logic circuitry, such as an exclusive-OR gate 24, a NAND gate 26, an AND gate 28 or an OR gate 30, that is associated with many of the stages. In such prior art gray code counters, the combined logic circuitry for each binary stage usually occupies about as much surface area on a chip as occupied by a D-type flip-flop.

With the continuing advances in microfabrication technologies, there is less and less space available on a chip to include circuitry, such as digital binary counter logic. In addition, it is preferable to have a digital binary counter proximate to a device from which it receives an input signal so as to reduce propagation delay. For example, in the field of FPA chip manufacture, a digital counter needs to be as small as possible so that it can be placed within the portion of FPA chip surface area allocated to the pixel it is monitoring, rather than on the periphery of the FPA chip. If the counter occupies too much chip surface area, the portion of the FPA chip surface area allocated to an individual pixel would increase, thereby decreasing resolution for the FPA chip. Also, if the digital counter occupies too much chip surface area, a counter having a shorter count range may need to be implemented, which would require higher output signal rates.

It is also known that the surface area on a chip that a digital counter will occupy is a function of the process used to manufacture the counter on the chip. As chips become smaller and smaller to require finer geometries for manufacture of circuitry, the cost of manufacturing such circuitry increases. By reducing the amount of circuitry on a chip, such as the size of the circuitry of a digital binary counter required to be included on a chip, substantial cost savings and implementation advantages can be achieved.

Therefore, there exists a need for a digital binary counter that can be sampled asynchronously with a minimum of read error and requires a minimum of logic circuitry in its implementation.

SUMMARY OF THE INVENTION

In accordance with a first aspect of the present invention, a gray code counter having a $2^N$ count capability and a minimum of logic circuitry in its implementation includes a chain of N pairs of D-type flip-flops connected as inverting rings. For each of the pairs of flip-flops in the chain, the Q output of a first flip-flop of the pair feeds the D input of a second flip-flop of the pair and the complementary Q output of the second flip-flop of the pair feeds the D input of the first flip-flop of the pair. In addition, the second flip-flop in each of the pairs of flip-flops in the chain supplies the clocks for the following pair. The gray code generated by the counter is obtained as follows. The first flip-flop of the first D-type pair in the chain supplies the least significant bit of the gray code, and the first flip-flops of successive D-type pairs supply, respectively, every other more significant bit following the least significant bit. Three input exclusive-OR gate circuits, which are coupled respectively to the second flip-flops of the D-type pairs, supply every other missing bit in the gray code pattern. The exclusive-OR gate circuit coupled to the second flip-flop of the first D-type pair supplies one bit greater than the least significant bit of the gray code, and the exclusive-OR gate circuits coupled respectively to the D-type pairs successively following the first D-type pair in the chain supply every other more significant following the missing bit supplied by the first D-type pair.

In an alternative preferred embodiment of the gray code counter in accordance with the first aspect of the present invention, each of the three input exclusive-OR gate circuits is replaced by a latch logic circuit. The latch logic circuit includes a two-input exclusive-OR gate having an output that is coupled to the input of a latch.

In accordance with a second aspect of the present invention, a gray code counter having a $2^N$ count capability and a minimum of logic circuitry in its implementation includes a chain of N cascaded toggle flip-flop stages, where each stage includes a master latch connected to a slave latch. The gray code generated by this counter is obtained by making available and monitoring the Q outputs of the respective master latches, except for the master latch of the first flip-flop stage. The least significant gray code bit through one less than the most significant gray code bit correspond, respectively, to the master outputs of the second through Nth flip-flop stages of the counter, and the most significant gray code bit corresponds to the slave output of the Nth flip-flop stage of the counter.

BRIEF DESCRIPTION OF THE DRAWINGS

Other objects and advantages of the present invention will be apparent from the following detailed description of the presently preferred embodiments, which description should be considered in conjunction with the accompanying drawings in which like references indicate similar elements and in which:

FIG. 9 is a schematic block diagram of the first five stages of the gray code counter of FIG. 8.

DETAILED DESCRIPTION OF THE INVENTION

Figure 3:
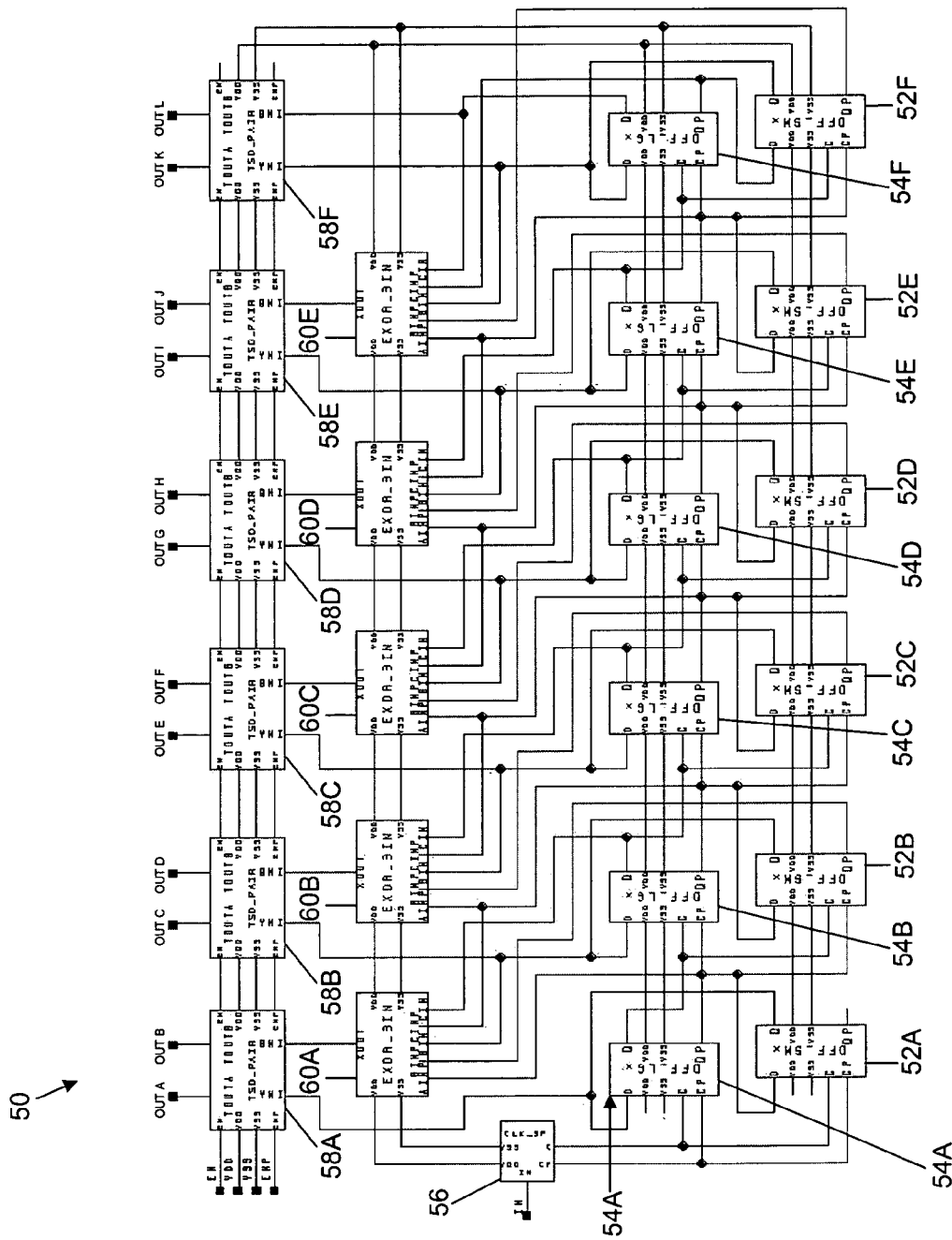
FIG. 3 is a schematic block diagram of a preferred embodiment of a gray code counter in accordance with the present invention.

FIG. 3 illustrates a preferred gray code binary counter 50 having a minimum of gate logic in accordance with a first aspect the present invention. Referring to FIG. 3, the counter 50 is a N=12 bit counter having bit outputs readable at OUTA-OUTL. The counter 50 includes a chain of six pairs of D-type flip-flops 52 and 54. The flip-flop pairs 52, 54 are coupled to respective bit readers 58. A clock input device 56 is coupled to the first of the flip-flop pairs 52, 54 in the chain. In addition, the counter 50 includes five, three input exclusive-OR gate circuits 60 coupled to the bit readers 58 and the flip-flop pairs 52, 54.

Referring to FIG. 3, the clock device 56 includes a counter input IN, a clock output C, a complementary clock output CP and power supply nodes VSS and VDD. The exclusive-OR gate circuits 60 include inputs AINP, BIN, BINP, CIN and CINP, an output XOUT and power supply nodes VDD and VSS. The bit readers 58 include inputs INA and INB, outputs TOUTA and TOUTB, enable inputs EN and ENP and power supply nodes VSS and VDD. The flip-flop pairs 52, 54 also include power supply nodes VSS and VDD. It is noted that FIG. 3 shows exemplary the connections among the power supply nodes VSS and VDD of the logic circuitry included within the counter 50 and that such power supply connections and the use of the bit readers 58 do not form a part of the present invention.

For ease of reference, the six pairs of D-type flip-flops in the chain of the counter 50 are referenced below using the designations of A–F, respectively. Also, the bit readers 58 are referenced below using the designations of A–F so as to correspond with their coupling to the six pairs of D-type flip-flops A–F, respectively. In addition, the five exclusive-OR gate circuits 60 are referenced below using the designations of A–E to correspond with their coupling to the inputs INB of the bit readers 58A–58E, respectively.

Each of the D-type flip-flops 52 and 54 is a well known logical circuit including a clock input C, a complementary clock input CP, a data input D, an output Q and a complementary output QP. See, for example, U.S. Pat. Nos. 4,618, 849 and 4,937,845, incorporated by reference herein.

The clock device 56 is any conventional prior art device for receiving an input signal representative of a count condition and which, based on the input signal, generates input and complementary clock pulses that cause the logic of a digital binary counter to perform counting operations.

The bit readers 58 are conventional prior art devices that can be configured in various ways and that, upon receipt of suitable enable control signal at the EN and ENP inputs, transfer the state of the binary stage of a counter (bit value output) supplied at an input to a corresponding output.

Referring to FIG. 3, the Q output of the flip-flop 52A is coupled to the D input of the flip-flop 54A. The complementary Q output of the flip-flop 54A is coupled to the D input of the flip-flop 52A. The clock and the complementary clock inputs of each of the flip-flops 52A and 54A are coupled to the external clock signal and complement of the external clock signal supplied, respectively, from the C and CP nodes of the clock input device 56.

For each of the flip-flops 54A–54E in the chain, the Q output is coupled to each of the clock inputs of the succeeding pair of flip-flops 52 and 54. Also for each of the flip-flops 54A–54E in the chain, the complementary Q output is coupled to each of the complementary clock inputs of the succeeding pair of flip-flops 52 and 54. For example, the Q output of the flip-flop 54A is coupled to the clock inputs C of the flip-flops 52B and 54B and the complementary Q output of the flip-flop 54A is coupled to the clock inputs CP of the flip-flops 52B and 54B.

Figure 4:
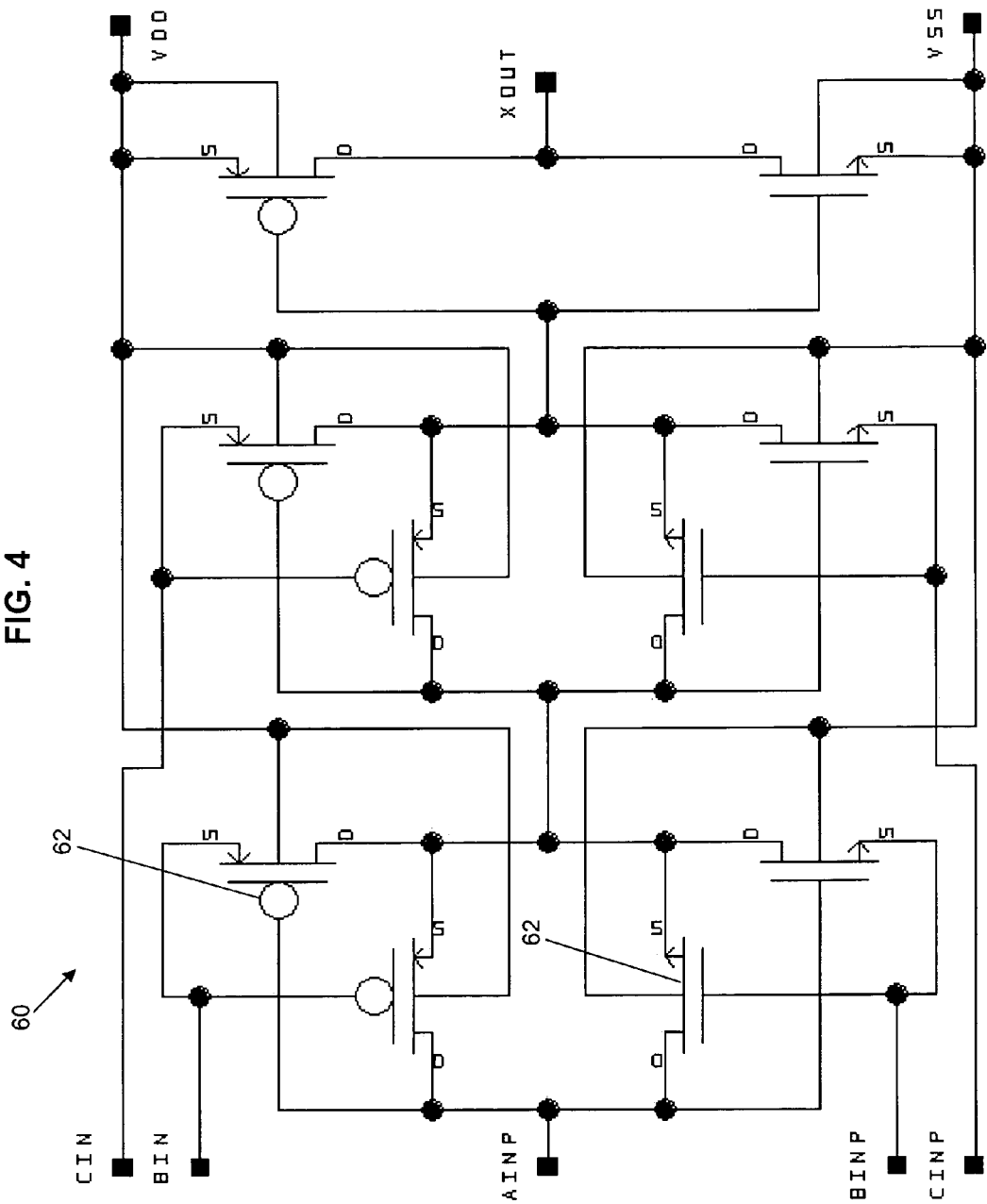
FIG. 4 is a schematic circuit diagram of an exclusive-OR gate circuit included in the gray code counter of FIG. 3.

FIG. 4 illustrates an exemplary embodiment of a conventional, three input exclusive-OR gate circuit 60 that can be implemented in the counter 50. Referring to FIG. 4, the exclusive-OR gate circuit 60 includes transistors 62 connected in a conventional manner to supply the logic function of a three input exclusive-OR gate having AIN, BIN and CIN as inputs.

Referring again to FIG. 3 and also to FIG. 4, for each of the pairs of the flip-flops 52, 54 in the chain except for the first pair 52A, 54A, the D input and the Q output of the flip-flop 54 are coupled to the BIN and CIN inputs, respectively, of a corresponding exclusive-OR gate circuit 60 and the complementary clock input of the flip-flop 54 is coupled to the AINP input of the corresponding exclusive-OR gate circuit 60. In addition, for each of the pairs of the flip-flops 52, 54 in the chain except for the first pair 52A, 54A, the complementary Q output and the D input of the flip-flop 52 are coupled to the BINP and CINP inputs, respectively, of the corresponding exclusive-OR gate 60. For example, the D input and the Q output of the flip-flop 54B are coupled to the BIN and CIN inputs, respectively, of the exclusive-OR gate circuit 60A; the complementary clock input of the flip-flop 54 is coupled to the AINP input of the exclusive-OR gate circuit 60A; and the complementary Q output and the D input of the flip-flop 52B are coupled to the BINP and CINP inputs, respectively, of the exclusive-OR gate circuit 60A.

In addition, the Q outputs of the respective flip-flops 52 in the chain are connected to the INA inputs of the bit readers 58. For example, the Q output of the flip-flop 52A is coupled to the INA input of the bit reader 58A. Also, the outputs XOUT of the exclusive-OR gate circuits 60 are connected to the inputs INB of the bit readers 58, respectively, except that the Q output of the flip-flop 54F, which is in the last pair of the chain, is coupled to the INB input of the bit reader 58F. For example, the XOUT output of the exclusive-OR gate circuit 60A is coupled to the INB input of the bit reader 58A.

In operation, the clock device 56 of the counter 50, upon receipt of input signals at IN, generates clock input pulses that are applied to the clock inputs of the pair of the flip-flops 52A, 54A. One of ordinary skill in the art can readily trace the propagation of clock input pulses through the flip-flops 52, 54 of the counter 50 to determine the bit outputs Q that would be generated at the flip-flops 52, 54. The gray code of the counter 50 can be sampled at any time to determine the counter value with a high level of accuracy, i.e., the potential error is ± one-half of a count, by applying suitable read out enable signals to the bit readers 58. The OUTA output of the bit reader 58A corresponds to the Q output of the flip-flop 52A and constitutes the least significant bit of a gray code. The OUTC, OUTE, OUTG, OUTI and OUTK outputs of the bit readers 58B–58F respectively correspond to the Q outputs of the flip-flops 54B–54F and constitute, in order of increasing significance, every other more significant bit of the gray code following the least significant gray code bit. In addition, the OUTB, OUTD, OUTF, OUTH, and OUTJ outputs of the bit readers 58A–58E, respectively, correspond to the XOUT outputs of the exclusive-OR gate circuits 60A–60E and constitute, starting from one more than the least significant bit of the gray code and increasing in order of significance, every other bit of the gray code. Further, the OUTL output of the bit reader 58F corresponds to the output Q of the flip-flop 54F and constitutes the most significant bit of the gray code.

Thus, in the inventive counter 50, the flip-flop 52 of each of the flip-flop pairs supplies every other bit of a gray code, and the exclusive-OR gate circuits 60 and the Nth flip-flop 54 in the chain supply the missing codes in the gray code pattern. It is noted that, in the counter 50, the exclusive-OR gate circuits 60 can have spikes in their outputs because one logic state can change, for example return to zero, an instant before another logic state is generated.

Figure 5:
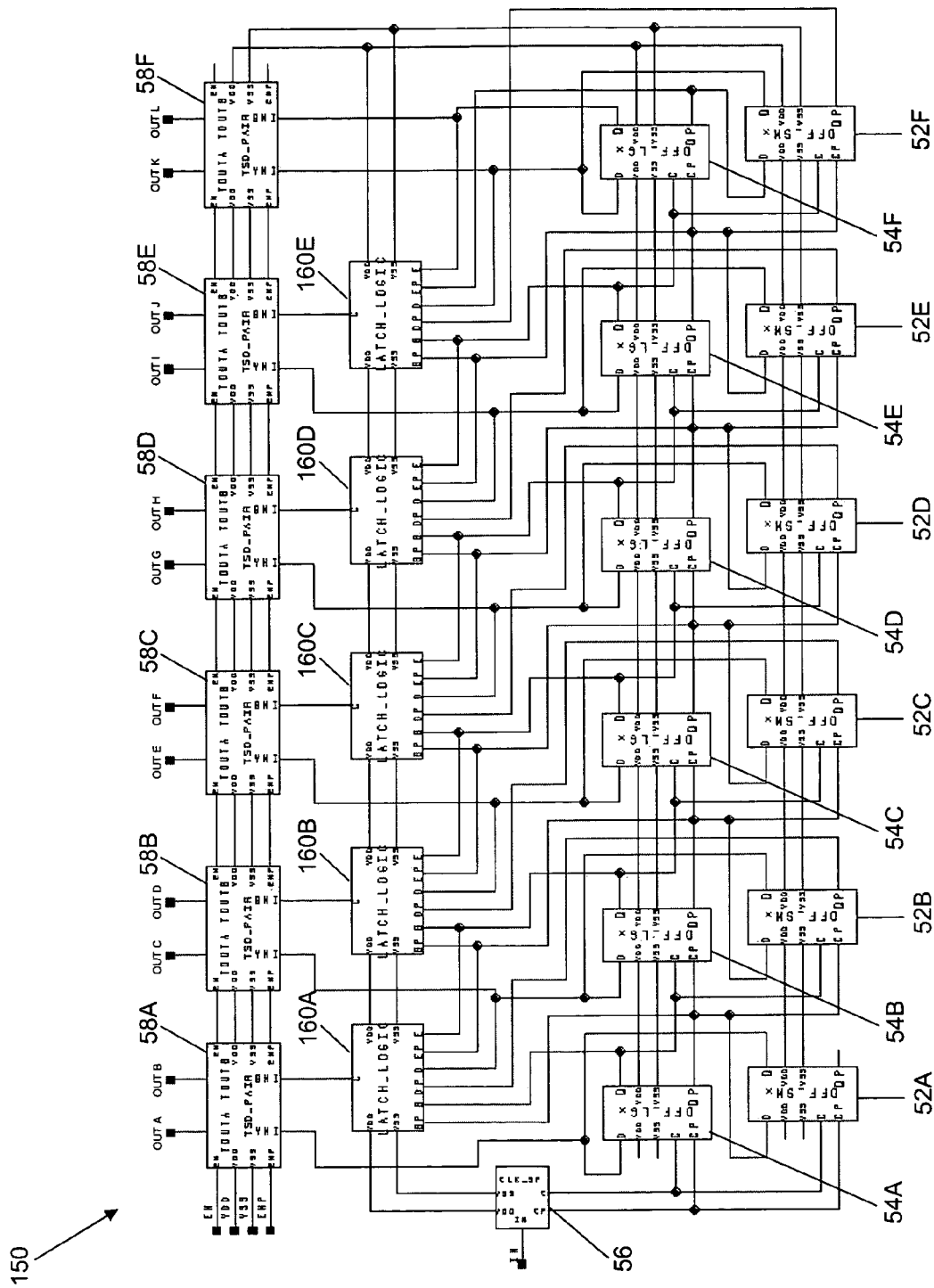
FIG. 5 is a schematic diagram of another preferred embodiment of a gray code counter in accordance with the present invention.

FIG. 5 illustrates another preferred embodiment of a gray code counter 150 having a minimum of logic circuitry in accordance with the first aspect of the present invention. Referring to FIG. 5, the counter 150 includes the same logic circuits, and the same connections of logic circuits to one another, as described above for the counter 50 illustrated in FIG. 3, except that latch logic circuits 160A-160E replace the exclusive-OR gate circuits 60A–60E, respectively. Logic circuit elements in the gray code counter 150 that are constructed and operate in the same manner as logic circuit elements included in the gray code counter 50 are referred to below using the same reference numerals.

Figure 6:
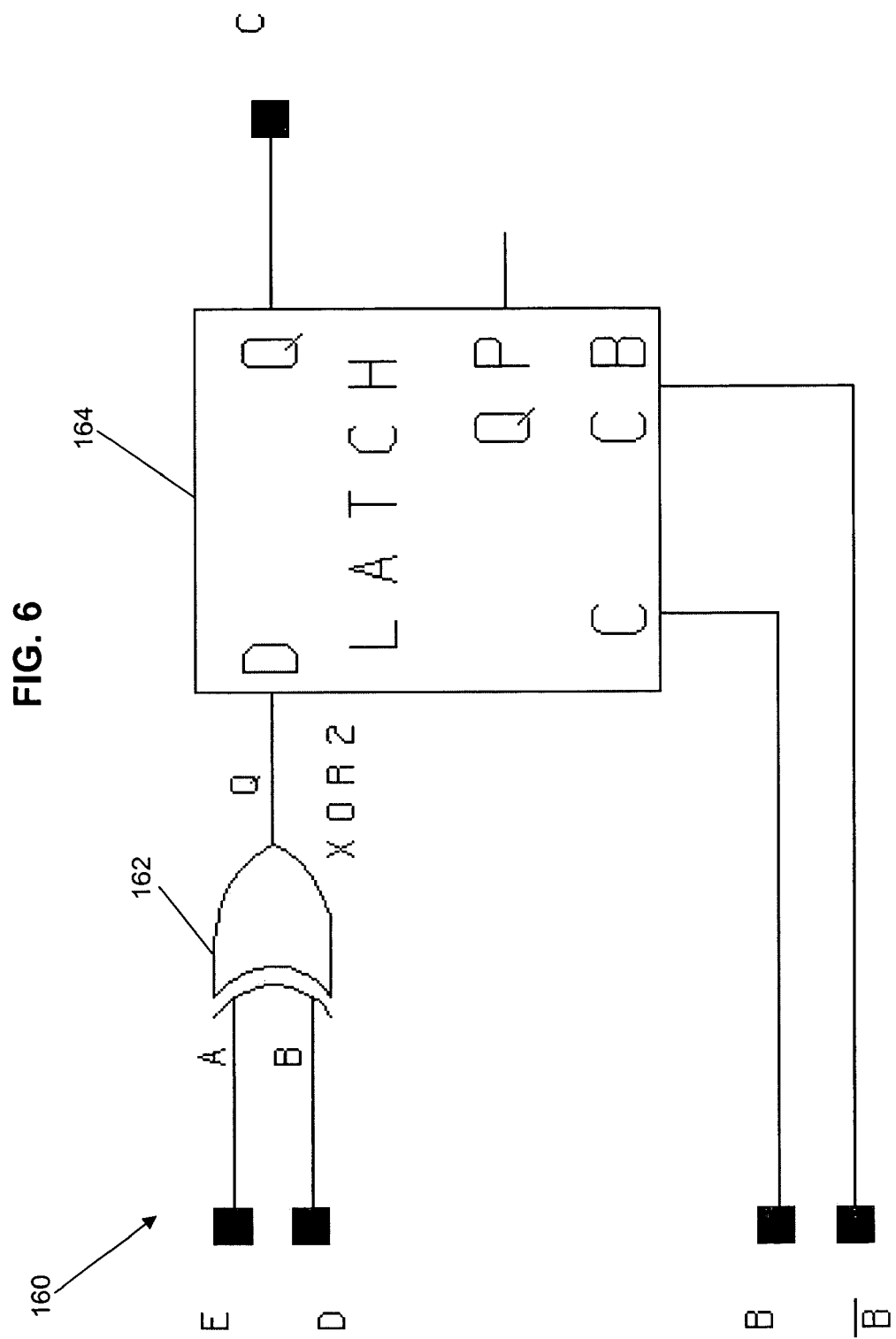
FIG. 6 is a schematic block diagram of a latch logic circuit included in the gray code counter of the FIG. 5.
Figure 7:
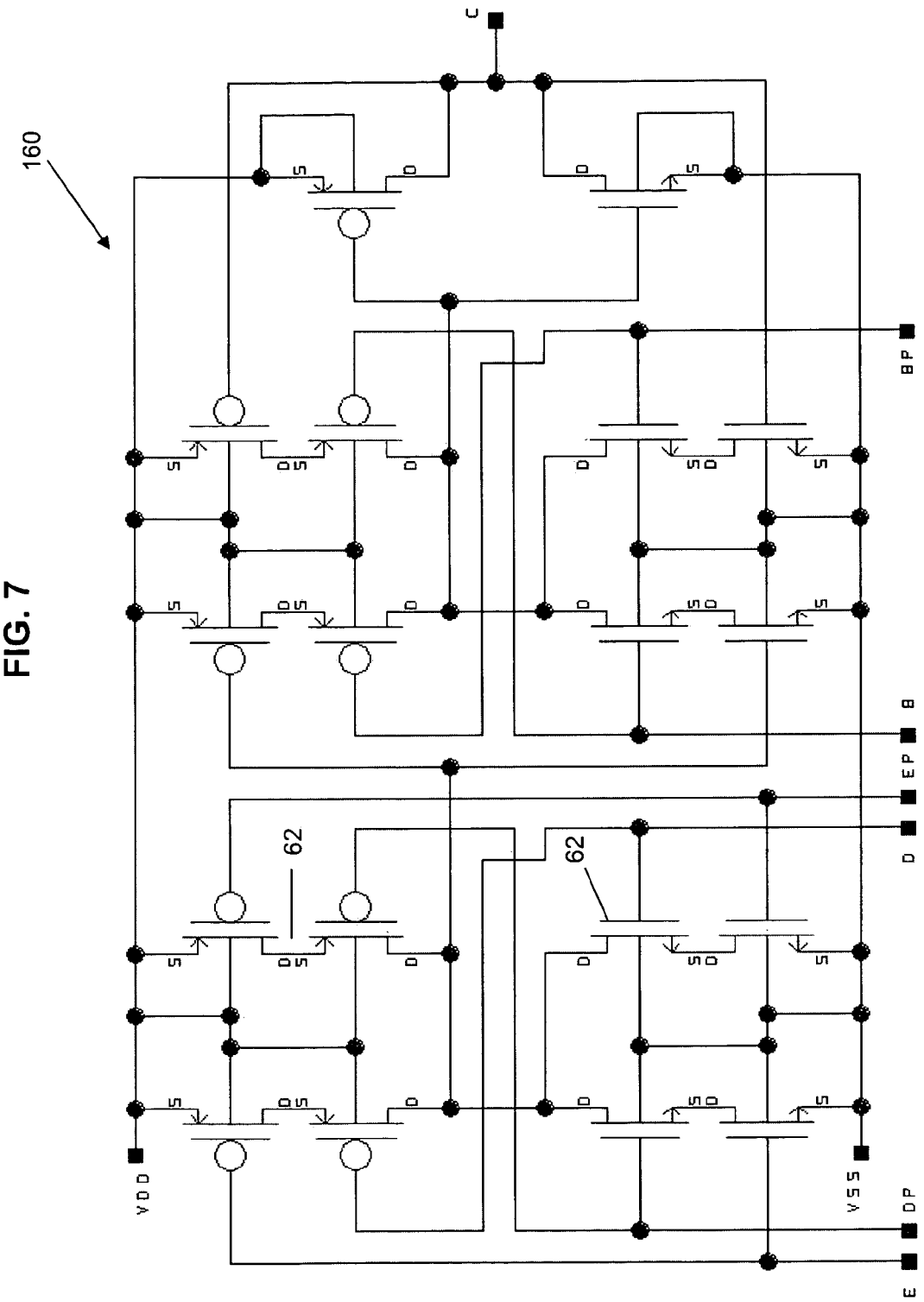
FIG. 7 is a schematic circuit diagram of the latch logic circuit included in the gray code counter of the FIG. 5.

Referring to FIG. 5, each of the latch logic circuits 160 includes inputs B, BP, D, DP, E and EP and an output C. FIG. 6 illustrates a block level diagram of the latch logic circuit 160. Referring to FIGS. 5 and 6, the latch logic circuit 160 includes a two input exclusive-OR gate 162 having inputs A and B coupled to inputs E and D, respectively, of the latch logic circuit 160. Further, the exclusive-OR gate 162 includes an output Q coupled to a D input of a latch 164, which is a D-type flip-flop. The D-type flip-flop 164 is a conventional logic gate, similar or identical to the flip-flops 52, 54, and includes a clock input C and a complementary clock input CB coupled to the inputs B and BP of the latch logic circuit 160, respectively, and an output Q coupled to the output C of the latch logic circuit 160. The logic gates that can be utilized in the implementation of the latch logic circuit 160 are conventional and well known in the art. FIG. 7 illustrates an exemplary circuit level diagram of the latch logic circuit 160 including transistors 62 interconnected to one another to form the inputs B, BP, D, DP, E and EP and the output C of the latch logic circuit 160 in its implementation in the counter 150.

Referring to FIGS. 5 and 6, for each of the pairs of the flip-flops 52, 54 in the chain except for the first pair 52A, 54A, the D input and the Q output of the flip-flop 54 are coupled to the D and E inputs, respectively, of a corresponding latch logic circuit 160 and the clock and complementary inputs of the flip-flop 54 are coupled to the B and BP, inputs, respectively, of the corresponding latch logic circuit 160. In addition, for each of the pairs of the flip-flops 52, 54 in the chain except for the first pair 52A, 54A, the D input and the complementary Q output of the flip-flop 52 are coupled to the EP and DP inputs, respectively, of the corresponding latch logic circuit 160 and the complementary clock input CP of the flip-flop 52 is coupled to the BP input of the corresponding latch logic circuit 160. For example, the D input and the Q output of the flip-flop 54B are coupled via the D and E inputs of the latch logic 160A, respectively, to the B and A inputs of the exclusive-OR gate 162A, and the clock input of the flip-flop 54B is coupled via the B input of the latch logic circuit 160A to the clock input C of the latch 164A. In addition, the D input and the complementary Q output of the flip-flop 52B are coupled to the EP and DP inputs, respectively, of the latch logic circuit 160A, and the complementary clock input CP of the flip-flop 52B is coupled via the BP input of the latch logic circuit 160A to the complementary clock input CB of the latch 164A.

Referring again to FIG. 5, the outputs C of the latch logic circuits 160 are connected to the inputs INB of the corresponding bit readers 58, respectively, except that the Q output of the flip-flop 54F is coupled to the input INB of the bit reader 58F. For example, the C output of the latch logic circuit 160A is coupled to the INB input of the bit reader 58A.

Figure 1A:
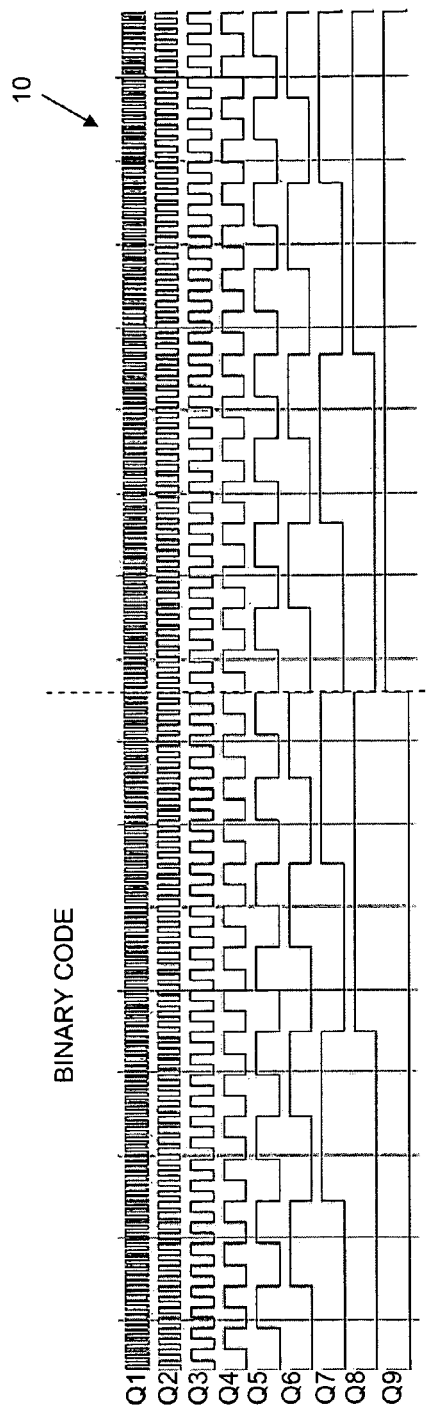
FIGS. 1A and 1B are waveform diagrams illustrating counting operation of a serial binary counter and a gray code binary counter, respectively.
Figure 1B:
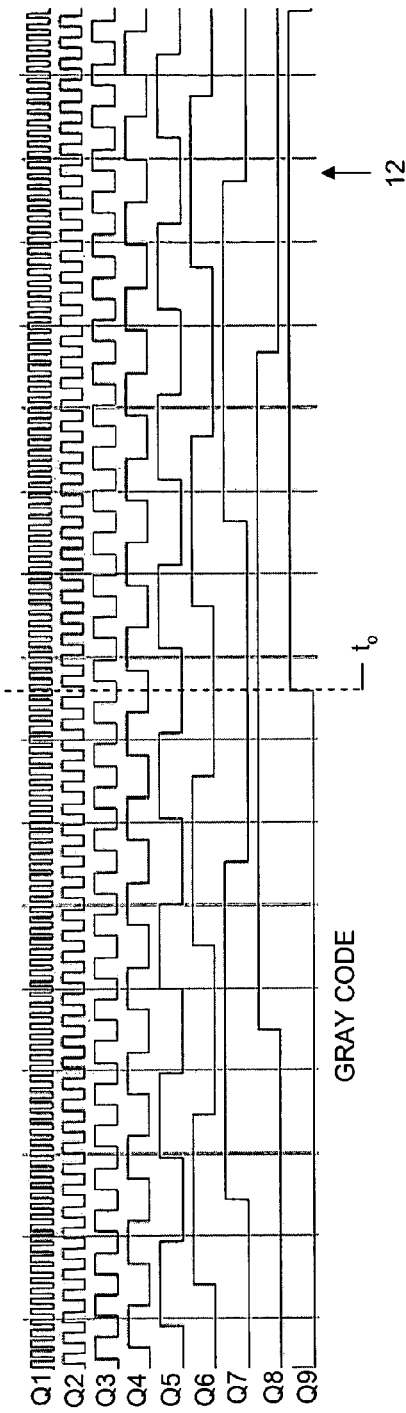
Figure 2:
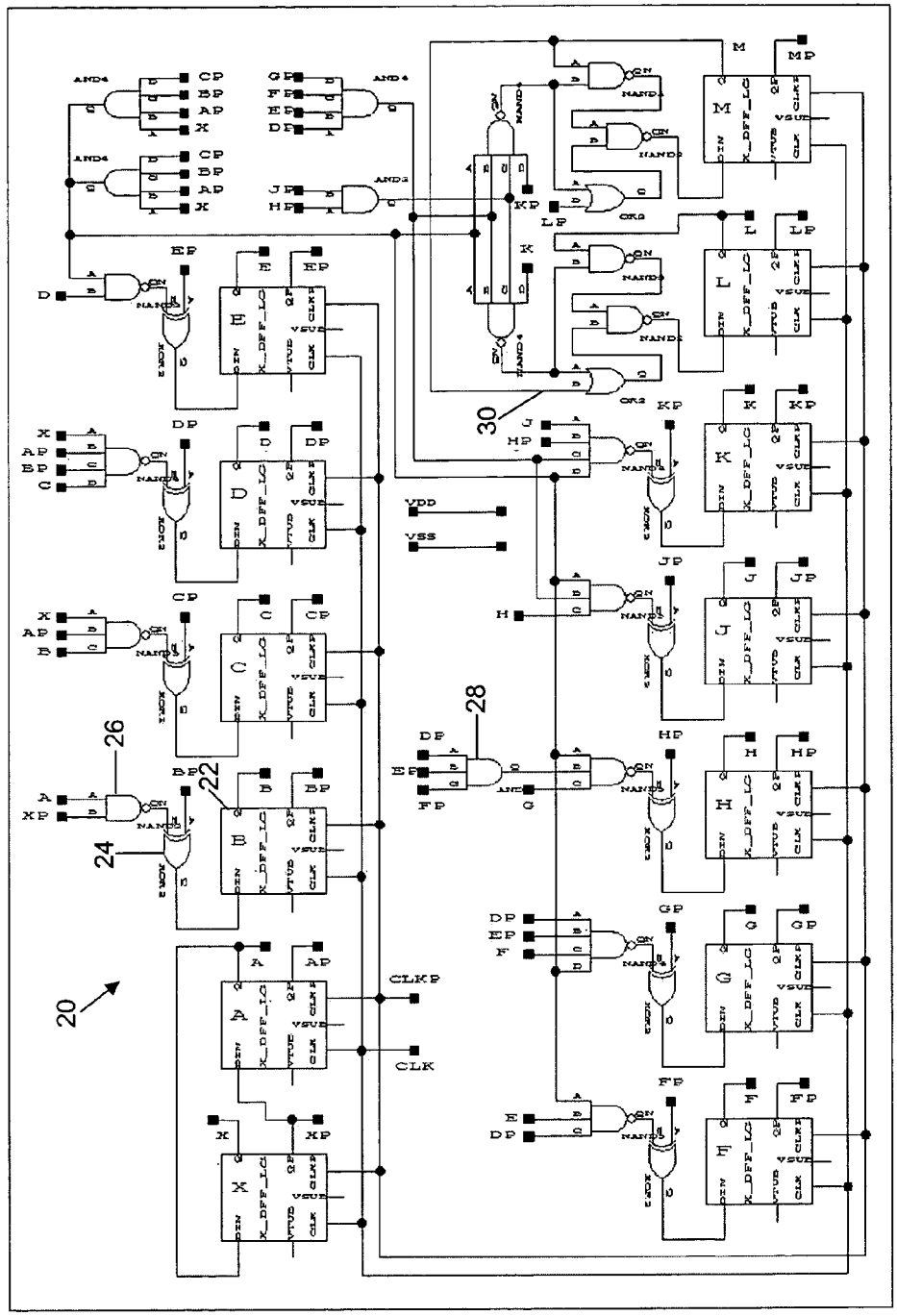
FIG. 2 is a schematic diagram of a prior art gray code counter logic circuitry implementation.

It is noted that the counter 150 advantageously supplies spike free gray code bit outputs at the bit reader 58 outputs because, in operation, as can be readily observed by one skilled in the art, when a clocking state sets the latch logic circuit 160 to a logic value, the latch logic circuit 160 holds the logic value until another clocking state resets the circuit 160. The use of a resetting logic state eliminates any potential spike at the output of the circuit 160, and thus at the counter 150 outputs. In addition, like the counter 50, the counter 150 has a clock-ripple delay of six flip-flops, which is comparable to the propagation delay of the logic circuit chain of a conventional gray code counter implementation, such as shown in FIG. 2.

Referring to the chain of inverted ring flip-flop pairs 52, 54 included in the counters 50 and 150 illustrated in FIGS. 3 and 5, respectively, it was observed that the chain of inverted ring flip-flop pairs generates a logic pattern that resembles the pattern at the master half and slave half of a single toggle flip-flop, which is conventionally formed from two latches connected to each other. In toggle flip-flop logic circuit implementations in the prior art, the master half of a toggle flip-flop is not supplied as an output. In accordance with the present invention, it was observed that if the master half Q output associated with the first toggle flip-flop stage of a binary ripple counter chain including N stages of toggle flip-flops is ignored, the master Q outputs of the remaining N−1 flip-flop stages, and the slave output Q of the last or Nth flip-flop stage in the chain, supply all bits of a gray code counter of any desired length and having $2^N$ count capability.

Figure 8:
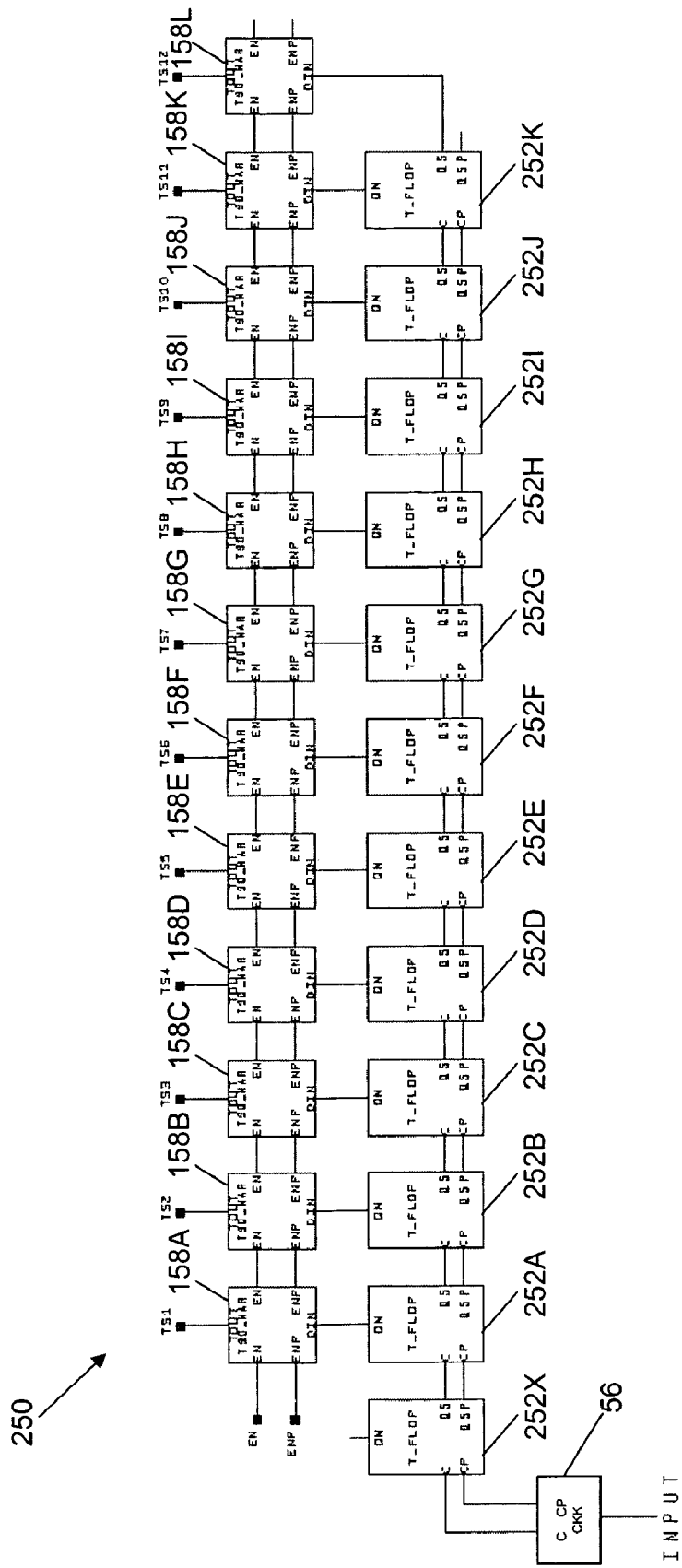
FIG. 8 is a schematic diagram of another preferred embodiment of a gray code counter in accordance with the present invention.

FIG. 8 illustrates a preferred embodiment of a gray code counter 250 including a chain of N stages of toggle flip-flops whose master half outputs are made available for monitoring as gray code bit outputs in accordance with a second aspect of the present invention. Referring to FIG. 8, the gray code counter 250 includes a chain of N=12 cascaded toggle flip-flop stages 252. The first toggle flip-flop stage 252X in the series is connected to a clock device 56. The toggle flip-flops stages 252A–252K, which consecutively follow the toggle flip-flop stage 252X, are coupled to single bit readers 158A–158K, respectively, and the toggle flip-flop 252K is also connected to a single bit reader 158L.

The single bit readers 158 are conventional, prior art devices which operate in a manner similar to the bit reader 58 and do not form a part of the present invention.

Referring to FIG. 9, which illustrates in detail only the first five toggle flip-flop stages of the counter 250, namely, the flip-flop stages 252X and 252A–252D, each of the stages 252 of the counter 250 includes a pair of conventional latches 262 and 264, such as D-type flip-flops, connected to each other in the conventional master-slave configuration. Each of the latches 262 and 264 has a clock input C, a complementary clock input CP, a data input D, an output Q and a complementary output QP. The clock device 56 supplies a clock input pulse to the clock input C of the latch 262X and the complementary clock input CP of the latch 264X, and supplies a complementary clock input pulse to the complementary clock input of the latch 262X and the clock input of the latch 264X. The D input of the latch 262X is coupled to the complementary Q output of the latch 264X, and the Q output of the latch 262X is coupled to the D input of the latch 264X.

In addition, referring again to FIG. 8 and also to FIG. 9, for each of the toggle stages 252A–252K, the D input of the latch 262 is coupled to the complementary Q output of the latch 264, and the Q output of the latch 262 is coupled to the D input of the latch 264. In addition, for each of the toggle stages 252A–252K, the Q output of the latch 264 is coupled to the clock input of the latch 262 and to the complementary clock input of the latch 264 of the next successive toggle stage. Further, for each of the toggle stages 252A–252K, the complementary Q output of the latch 264 is coupled to the complementary clock input of the latch 262 and the clock input of the latch 264 of the next successive toggle stage. For example, for the toggle stage 252A, the D input of the latch 262A is coupled to the complementary Q output of the latch 264A and the Q output of the master latch 262A is coupled to the D input of the latch 264A. The Q output of the slave latch 264A is coupled to the clock input of the latch 262B and to the complementary clock input of the latch 264B of the toggle stage 252B. In addition, the complementary Q output of the latch 264A is coupled to the complementary clock input of the latch 262B and to the clock input of the latch 264B of the toggle stage 252B.

In addition, the clock input of the latch 262A and the complementary clock input of the latch 264A are connected to the Q output of the latch 264X, and the complementary clock input of the latch 262A and the clock input of the latch 264A are connected to the complementary Q output of the latch 264X.

Further, the Q outputs of the latches 262 of the stages 252A–252K, in other words, the master outputs of the first flip-flops in the respective master-slave flip-flop pairs constituting each toggle flip-flop stage, are connected to inputs DIN of the bit readers 158A–158K, respectively. The gray code bit outputs that would be produced in the stages 252 of the counter 250 are readily ascertainable by one skilled in the art. The inputs DIN constitute, respectively, a least significant bit through one less than the most significant bit of a gray code that would be generated based on the supply of an external clock signal to the clocking device 56 and propagation of clock input pulse through the toggle flip-flop stages 252. The Q slave output of the latch 264K of the stage 252K is connected to the input DIN of the bit reader 158L and constitutes the most significant bit of the gray code.

Thus, in the gray code counter 250, the output of the first (master) flip-flop of the first toggle flip-flop stage 252X in the chain is ignored and all of the subsequent master outputs of the flip-flop stages 252A–252K constitute bit values of a gray code output. TABLE I below illustrates the gray code output that a 5 stage counter implementation of the counter 250, as shown in FIG. 9, would generate at the master outputs AM, BM, CM and DM of the 252A–252D, respectively, based on receipt of pulse inputs C supplied from the clocking device 56. The slave outputs XS, AS, BS, CS and DS, and the ignored master outputs XM, are also shown in Table I for completeness.

TABLE I

| DS | DM | CS | CM | BS | BM | AS | AM | XS | XM | C |
|----|----|----|----|----|----|----|----|----|----|---|
| Ø | Ø | Ø | Ø | Ø | Ø | Ø | Ø | Ø | Ø | 1 |
| Ø | Ø | Ø | Ø | Ø | Ø | Ø | Ø | Ø | 1 | Ø |
| Ø | Ø | Ø | Ø | Ø | Ø | Ø | 1 | 1 | 1 | 1 |
| Ø | Ø | Ø | Ø | Ø | Ø | Ø | 1 | 1 | Ø | Ø |
| Ø | Ø | Ø | Ø | Ø | 1 | 1 | 1 | Ø | Ø | 1 |
| Ø | Ø | Ø | Ø | Ø | 1 | 1 | 1 | Ø | 1 | Ø |
| Ø | Ø | Ø | Ø | Ø | 1 | 1 | Ø | 1 | 1 | 1 |
| Ø | Ø | Ø | Ø | Ø | 1 | 1 | Ø | 1 | Ø | Ø |
| Ø | Ø | Ø | 1 | 1 | 1 | Ø | Ø | Ø | Ø | 1 |
| Ø | Ø | Ø | 1 | 1 | 1 | Ø | Ø | Ø | 1 | Ø |
| Ø | Ø | Ø | 1 | 1 | 1 | Ø | 1 | 1 | 1 | 1 |
| Ø | Ø | Ø | 1 | 1 | 1 | Ø | 1 | 1 | Ø | Ø |
| Ø | Ø | Ø | 1 | 1 | Ø | 1 | 1 | Ø | Ø | 1 |
| Ø | Ø | Ø | 1 | 1 | Ø | 1 | 1 | Ø | 1 | Ø |
| Ø | Ø | Ø | 1 | 1 | Ø | 1 | Ø | 1 | 1 | 1 |
| Ø | Ø | Ø | 1 | 1 | Ø | 1 | Ø | 1 | Ø | Ø |
| Ø | 1 | 1 | 1 | Ø | Ø | Ø | Ø | Ø | Ø | 1 |
| Ø | 1 | 1 | 1 | Ø | Ø | Ø | Ø | Ø | 1 | Ø |
| Ø | 1 | 1 | 1 | Ø | Ø | Ø | 1 | 1 | 1 | 1 |
| Ø | 1 | 1 | 1 | Ø | Ø | Ø | 1 | 1 | Ø | Ø |
| Ø | 1 | 1 | 1 | Ø | 1 | 1 | 1 | Ø | Ø | 1 |
| Ø | 1 | 1 | 1 | Ø | 1 | 1 | 1 | Ø | 1 | Ø |
| Ø | 1 | 1 | 1 | Ø | 1 | 1 | Ø | 1 | 1 | 1 |
| Ø | 1 | 1 | 1 | Ø | 1 | 1 | Ø | 1 | Ø | Ø |
| Ø | 1 | 1 | Ø | 1 | 1 | Ø | Ø | Ø | Ø | 1 |
| Ø | 1 | 1 | Ø | 1 | 1 | Ø | Ø | Ø | 1 | Ø |
| Ø | 1 | 1 | Ø | 1 | 1 | Ø | 1 | 1 | 1 | 1 |
| Ø | 1 | 1 | Ø | 1 | 1 | Ø | 1 | 1 | Ø | Ø |
| Ø | 1 | 1 | Ø | 1 | Ø | 1 | 1 | Ø | Ø | 1 |
| Ø | 1 | 1 | Ø | 1 | Ø | 1 | 1 | Ø | 1 | Ø |
| Ø | 1 | 1 | Ø | 1 | Ø | 1 | Ø | 1 | 1 | 1 |
| Ø | 1 | 1 | Ø | 1 | Ø | 1 | Ø | 1 | Ø | Ø |
| 1 | 1 | Ø | Ø | Ø | Ø | Ø | Ø | Ø | Ø | 1 |
| 1 | 1 | Ø | Ø | Ø | Ø | Ø | Ø | Ø | 1 | Ø |
| 1 | 1 | Ø | Ø | Ø | Ø | Ø | 1 | 1 | 1 | 1 |
| 1 | 1 | Ø | Ø | Ø | Ø | Ø | 1 | 1 | Ø | Ø |
| 1 | 1 | Ø | Ø | Ø | 1 | 1 | 1 | Ø | Ø | 1 |
| 1 | 1 | Ø | Ø | Ø | 1 | 1 | 1 | Ø | 1 | Ø |
| 1 | 1 | Ø | Ø | Ø | 1 | 1 | Ø | 1 | 1 | 1 |
| 1 | 1 | Ø | Ø | Ø | 1 | 1 | Ø | 1 | Ø | Ø |
| 1 | 1 | Ø | 1 | 1 | 1 | Ø | Ø | Ø | Ø | 1 |
| 1 | 1 | Ø | 1 | 1 | 1 | Ø | Ø | Ø | 1 | Ø |
| 1 | 1 | Ø | 1 | 1 | 1 | Ø | 1 | 1 | 1 | 1 |
| 1 | 1 | Ø | 1 | 1 | 1 | Ø | 1 | 1 | Ø | Ø |
| 1 | 1 | Ø | 1 | 1 | Ø | 1 | 1 | Ø | Ø | 1 |
| 1 | 1 | Ø | 1 | 1 | Ø | 1 | 1 | Ø | 1 | Ø |
| 1 | 1 | Ø | 1 | 1 | Ø | 1 | Ø | 1 | 1 | 1 |
| 1 | 1 | Ø | 1 | 1 | Ø | 1 | Ø | 1 | Ø | Ø |
| 1 | Ø | 1 | 1 | Ø | Ø | Ø | Ø | Ø | Ø | 1 |
| 1 | Ø | 1 | 1 | Ø | Ø | Ø | Ø | Ø | 1 | Ø |
| 1 | Ø | 1 | 1 | Ø | Ø | Ø | 1 | 1 | 1 | 1 |
| 1 | Ø | 1 | 1 | Ø | Ø | Ø | 1 | 1 | Ø | Ø |
| 1 | Ø | 1 | 1 | Ø | 1 | 1 | 1 | Ø | Ø | 1 |
| 1 | Ø | 1 | 1 | Ø | 1 | 1 | 1 | Ø | 1 | Ø |
| 1 | Ø | 1 | 1 | Ø | 1 | 1 | Ø | 1 | 1 | 1 |
| 1 | Ø | 1 | 1 | Ø | 1 | 1 | Ø | 1 | Ø | Ø |
| 1 | Ø | 1 | Ø | 1 | 1 | Ø | Ø | Ø | Ø | 1 |
| 1 | Ø | 1 | Ø | 1 | 1 | Ø | Ø | Ø | 1 | Ø |
| 1 | Ø | 1 | Ø | 1 | 1 | Ø | 1 | 1 | 1 | 1 |
| 1 | Ø | 1 | Ø | 1 | 1 | Ø | 1 | 1 | Ø | Ø |
| 1 | Ø | 1 | Ø | 1 | Ø | 1 | 1 | Ø | Ø | 1 |
| 1 | Ø | 1 | Ø | 1 | Ø | 1 | 1 | Ø | 1 | Ø |
| 1 | Ø | 1 | Ø | 1 | Ø | 1 | Ø | 1 | 1 | 1 |
| 1 | Ø | 1 | Ø | 1 | Ø | 1 | Ø | 1 | Ø | Ø |

Advantageously, the binary ripple counter implementation of the gray code counter 250 supplies spike free bit outputs when decoded because only one bit output can change at a time for a clock input. Furthermore, the counter 250 occupies relatively little space because the logic circuitry only includes master-slave flip-flop pairs and additional logic circuitry, such as existing in prior art gray code binary counters, is not required.

It is noted that, although the gray code counter 250 has about twice the ripple delay of the counters 50 and 150 because the input signal propagates through 12 flip-flops, this delay is usually not of concern in a digital counter application, such as in a FPA device, unless operation at a very high clock input rate is desired.

In a preferred embodiment, the gray code counter in accordance with first or second aspects of the invention is implemented on a very small FPA chip having a limited amount of space available for each gray code binary counter that needs to be utilized with a corresponding pixel.

In an alternative preferred embodiment of the gray code counter 250, the counter 250 does not include the first flip-flop stage 252X, which functions to divide the frequency of a supplied external clock signal by one-half. The stage 252X is omitted because the device or system, such as a FPA device, that is the source of an external clock signal for the counter 250 provides a half-frequency input signal for use as the external clock signal. Referring to FIG. 9, in an alternative embodiment, where a half-frequency input clock signal is supplied from the source, the clocking device 56 is connected to the clock inputs of the latches of the stage 252A in the same manner as it is connected to the latches of the stage 252X when full frequency input clock signals are supplied from a source.

In a preferred implementation of the gray code counter 250, an FPA which includes, inter alia, decoders that perform address scanning on the x and y edges of an x-by-y pixel array, supplies a half-frequency (double period) clock signal directly to the clock signal inputs of the pair of latches of the flip-flop stage 252A. The half-frequency clock signal is generated at the FPA, for example, by a suitable crystal oscillator or pre-processing a full frequency clock signal through a pair of latches configured to operate as a toggle flip-flop that divides the frequency of the supplied signal by one-half.

The inclusion of a gray code counter 250, where the first flip-flop stage 252X is eliminated, in, for example, a FPA device which operates at cryogenic temperatures, advantageously reduces the power required to operate the counter by approximately one-half and also decreases power dissipation in the FPA device. This power savings and reduced power dissipation are achieved based on the following, well known relationship between the power required for flip-flop operation and frequency at which operations are performed at a flip-flop stage:

Power=(Capacitance)(Voltage$^2$)(Frequency).

As the first toggle flip-flop stage of a chain of N toggle flip-flop stages that form a binary ripple count operates at the highest clock frequency, the power required for operating a flip-flop stage is proportional to the frequency at which the flip-flop stages, i.e., the transistors that comprise the flip-flop stage, operate. Each successive flip-flop stage in the binary counter chain decreases the operating clock frequency by one-half, such that elimination of the first flip-flop stage achieves a significant power savings. This savings in required power, in turn, decreases overall power dissipation. Reduced power dissipation is especially advantageous in an FPA application of digital counters, because a digital gray code counter is required for each pixel of an array and an array can have $512^2$, $1024^2$ or more pixels.

What is claimed is:

1. A gray code counter for generating a gray code having N bits comprising:
   a first toggle flip-flop stage including first and second latches;
   N−1 cascaded toggle flip-flop stages each including third and fourth latches;
   wherein each of the latches has a clock input, a complementary clock input, a data D input, a Q output and a complementary Q output;
   wherein, in the first stage, the clock input of the first latch and the complementary clock input of the second latch are for receiving an external clock signal, the complementary clock input of the first latch and the clock input of the second latch are for receiving a complement of the external clock signal, the D input of the first latch is coupled to the complementary Q output of the second latch, and the Q output of the first latch is coupled to the D input of the second latch;
   wherein, in each of the N−1 stages, the D input of the third latch is coupled to the complementary Q output of the fourth latch, the Q output of the third latch is coupled to the D input of the fourth latch, the Q output of the fourth latch is coupled to the clock input of the third latch and the complementary clock input of the fourth latch of a successive N−1$^{th}$ stage, and the complementary Q output of the fourth latch is coupled to the complementary clock input of the third latch and the clock input of the fourth latch of the successive N−1$^{th}$ stage;
   wherein, for the first of the cascaded N−1 stages, the clock input of the third latch and the complementary clock input of the fourth latch are connected to the Q output of the second latch, and the complementary clock input of the third latch and the clock input of the fourth latch are connected to the complementary Q output of the second latch; and
   wherein the Q outputs of the third latches of each of the successive N−1$^{th}$ stages constitute, respectively, a least significant bit through one less than the most significant bit of a gray code generated based on the external clock signal, and wherein the Q output of the fourth latch of the N$^{th}$ stage constitutes the most significant bit of the gray code.

2. A gray code counter for generating a gray code having N bits comprising:
   N−1 cascaded toggle flip-flop stages each including first and second latches, wherein each of the latches has a clock input, a complementary clock input, a data D input, a Q output and a complementary Q output;
   wherein, in the first stage of the N−1 cascaded stages, the clock input of the first latch and the complementary clock input of the second latch are for receiving an external clock signal, the complementary clock input of the first latch and the clock input of the second latch are for receiving a complement of the external clock signal, the D input of the first latch is coupled to the complementary Q output of the second latch, and the Q output of the first latch is coupled to the D input of the second latch;
   wherein, in each of the second through the N−1$^{th}$ stages, the D input of the first latch is coupled to the complementary Q output of the second latch, the Q output of the first latch is coupled to the D input of the second latch, the Q output of the second latch is coupled to the clock input of the first latch and the complementary clock input of the second latch of a successive N−1$^{th}$ stage, and the complementary Q output of the second latch is coupled to the complementary clock input of the first latch and the clock input of the second latch of the successive N−1$^{th}$ stage;
   wherein, for the second of the cascaded N−1 stages, the clock input of the first latch and the complementary clock input of the second latch are connected to the Q output of the second latch of the first N−1$^{th}$ stage, and the complementary clock input of the first latch and the clock input of the second latch are connected to the complementary Q output of the second latch of the first N−1$^{th}$ stage; and
   wherein the Q outputs of the first latches of each of the successive N−1 stages constitute, respectively, a least significant bit through one less than the most significant bit of a gray code generated based on the external clock signal, and wherein the Q output of the second latch of the N$^{th}$ stage constitutes the most significant bit of the gray code.

3. A gray code counter for generating a gray code having N bits comprising:
   a chain of N pairs of first and second D-type flip-flops, wherein each of the D-type flip-flops has a clock input, a complementary clock input, a data D input, a Q output and a complementary Q output;
   wherein, in the first pair, the Q output of the first flip-flop is coupled to the D input of the second flip-flop, the complementary Q output of the second flip-flop is coupled to the D input of the first flip-flop, and the clock and the complementary clock inputs of each of the first and second flip-flops are for coupling to an external clock signal and a complement of the external clock signal, respectively;
   wherein, for a jth pair of the N pairs in the chain except for the N$^{th}$ pair, the Q output of the second flip-flop is coupled to each of the clock inputs of the first and second flip-flops of a pair succeeding the jth pair in the chain, and the complementary Q output of the second flip-flop is coupled to each of the complementary clock inputs of the first and second flip-flops of the pair succeeding the jth pair in the chain;
   wherein, for each of the N pairs following the first pair of the N pairs in the chain, the D input, the Q output, the complementary Q output and the complementary clock input of the second flip-flop and the complementary Q output of the first flip-flop are coupled to a three input exclusive-OR gate circuit, and wherein the exclusive OR gate circuit includes an output; and
   wherein the Q outputs of the first flip-flops of the successive N pairs in the chain constitute, respectively, the least significant bit and every other more significant bit of a gray code generated based on the external clock signal, and wherein the successive exclusive-OR gate circuit outputs constitute, respectively, one more than the least significant bit and every other more significant bit of the gray code.

4. A gray code counter for generating a gray code having N bits comprising:
   a chain of N pairs of first and second D-type flip-flops, wherein each of the D-type flip flops has a clock input, a complementary clock input, a data D input, a Q output and a complementary Q output;

wherein, in the first pair, the Q output of the first flip-flop is coupled to the D input of the second flip-flop, the complementary Q output of the second flip-flop is coupled to the D input of the first flip-flop, and the clock and the complementary clock inputs of each of the first and second flip-flops are for coupling to an external clock signal and a complement of the external clock signal, respectively;

wherein, for a jth pair of the N pairs in the chain except for the Nth pair, the Q output of the second flip-flop is coupled to each of the clock inputs of the first and second flip-flops of a pair succeeding the jth pair in the chain and the complement of the Q output of the second flip-flop is coupled to each of the complementary clock inputs of the first and second flip-flops of the pair succeeding the jth pair in the chain;

wherein, for each of the N pairs following the first of the N pairs in the chain, the D input, and the Q output of the second flip-flop are coupled to first and second inputs, respectively, of an exclusive-OR gate, wherein the exclusive OR gate includes an output coupled to an input of a latch, wherein the latch includes an output and a clock input, a complementary clock input, the clock inputs of the latch being coupled to the clock and complementary clock inputs of the second flip-flop, respectively, and wherein the Q outputs of the first flip-flops of the successive N pairs in the chain constitute, respectively, the least significant gray code bit value and every other more significant bit generated based on the external clock signal, and wherein the successive latch outputs constitute, respectively, one more than the least significant bit and every other more significant bit of the gray code.

5. The counter of claim 4, wherein the latch is a D-type flip-flop.

6. A focal plane array apparatus including:
an array of imaging pixels; and
digital binary counters coupled to the respective pixels, where at least one the counters is an N bit gray code counter comprising:
  a first toggle flip-flop stage including first and second latches;
  N−1 cascaded toggle flip-flop stages each including third and fourth latches;
  wherein each of the latches has a clock input, a complementary clock input, a data D input, a Q output and a complementary Q output;
  wherein, in the first stage, the clock input of the first latch and the complementary clock input of the second latch are for receiving an external clock signal, the complementary clock input of the first latch and the clock input of the second latch are for receiving a complement of the external clock signal, the D input of the first latch is coupled to the complementary Q output of the second latch, and the Q output of the first latch is coupled to the D input of the second latch;
  wherein, in each of the N−1 stages, the D input of the third latch is coupled to the complementary Q output of the fourth latch, the Q output of the third latch is coupled to the D input of the fourth latch, the Q output of the fourth latch is coupled to the clock input of the third latch and the complementary clock input of the fourth latch of a successive N−1$^{th}$ stage, and the complementary Q output of the fourth latch is coupled to the complementary clock input of the third latch and the clock input of the fourth latch of the successive N−1$^{th}$ stage;
  wherein, for the first of the cascaded N−1 stages, the clock input of the third latch and the complementary clock input of the fourth latch are connected to the Q output of the second latch, and the complementary clock input of the third latch and the clock input of the fourth latch are connected to the complementary Q output of the second latch; and
  wherein the Q outputs of the third latches of each of the successive N−1$^{th}$ stages constitute, respectively, a least significant bit through one less than the most significant bit of a gray code generated based on the external clock signal, and wherein the Q output of the fourth latch of the N$^{th}$ stage constitutes the most significant bit of the gray code.

7. A focal plane array apparatus including:
an array of imaging pixels; and
digital binary counters coupled to the respective pixels, where at least one the counters is an N bit gray code counter comprising:
  N−1 cascaded toggle flip-flop stages each including first and second latches, wherein each of the latches has a clock input, a complementary clock input, a data D input, a Q output and a complementary Q output;
  wherein, in the first stage of the N−1 cascaded stages, the clock input of the first latch and the complementary clock input of the second latch are for receiving an external clock signal, the complementary clock input of the first latch and the clock input of the second latch are for receiving a complement of the external clock signal, the D input of the first latch is coupled to the complementary Q output of the second latch, and the Q output of the first latch is coupled to the D input of the second latch;
  wherein, in each of the second through the N−1$^{th}$ stages, the D input of the first latch is coupled to the complementary Q output of the second latch, the Q output of the first latch is coupled to the D input of the second latch, the Q output of the second latch is coupled to the clock input of the first latch and the complementary clock input of the second latch of a successive N−1$^{th}$ stage, and the complementary Q output of the second latch is coupled to the complementary clock input of the first latch and the clock input of the second latch of the successive N−1$^{th}$ stage;
  wherein, for the second of the cascaded N−1 stages, the clock input of the first latch and the complementary clock input of the second latch are connected to the Q output of the second latch of the first N−1$^{th}$ stage, and the complementary clock input of the first latch and the clock input of the second latch are connected to the complementary Q output of the second latch of the first N−1$^{th}$ stage; and
  wherein the Q outputs of the first latches of each of the successive N−1 stages constitute, respectively, a least significant bit through one less than the most significant bit of a gray code generated based on the external clock signal, and wherein the Q output of the second latch of the N$^{th}$ stage constitutes the most significant bit of the gray code.

* * * * *

UNITED STATES PATENT AND TRADEMARK OFFICE
CERTIFICATE OF CORRECTION

PATENT NO. : 6,931,091 B2
DATED : August 16, 2005
INVENTOR(S) : Heimbigner

It is certified that error appears in the above-identified patent and that said Letters Patent is hereby corrected as shown below:

Column 1,
Line 64, "the time to" should read -- the time $t_0$ --.

Column 13,
Line 40, "at least one the counters" should read -- at least one of the counters --.

Column 14,
Line 21, "at least one the counters" should read -- at least one of the counters --.

Signed and Sealed this

Third Day of January, 2006

JON W. DUDAS
*Director of the United States Patent and Trademark Office*